US009844162B2

(12) United States Patent
Tang

(10) Patent No.: US 9,844,162 B2
(45) Date of Patent: Dec. 12, 2017

(54) SLIDING RAIL FIXING STRUCTURE OF SERVER CABINET

(71) Applicant: HON HAI PRECISION INDUSTRY CO., LTD., New Taipei (TW)

(72) Inventor: Chen-Sheng Tang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 9 days.

(21) Appl. No.: 15/133,148

(22) Filed: Apr. 19, 2016

(65) Prior Publication Data

US 2017/0295664 A1    Oct. 12, 2017

(30) Foreign Application Priority Data

Apr. 12, 2016  (CN) .......................... 2016 1 0222832

(51) Int. Cl.
| | |
|---|---|
| *A47B 88/00* | (2017.01) |
| *A47B 88/04* | (2006.01) |
| *H05K 7/14* | (2006.01) |
| *A47B 96/07* | (2006.01) |
| *A47B 96/06* | (2006.01) |
| *A47B 88/43* | (2017.01) |
| *A47B 88/44* | (2017.01) |

(52) U.S. Cl.
CPC ......... *H05K 7/1489* (2013.01); *A47B 96/068* (2013.01); *A47B 96/07* (2013.01); *A47B 88/43* (2017.01); *A47B 88/44* (2017.01)

(58) Field of Classification Search
CPC ........ H05K 7/14; H05K 7/1489; H05K 7/183; A47B 88/43; A47B 88/44; A47B 96/068; A47B 96/07

USPC ............. 248/220.22, 220.41, 241, 244, 250; 211/26, 86.01, 123; 312/334.4
See application file for complete search history.

(56) References Cited

U.S. PATENT DOCUMENTS

| | | | | |
|---|---|---|---|---|
| 7,699,279 B2 * | 4/2010 | Chen | ...................... | A47B 88/43 248/220.22 |
| 7,731,142 B2 * | 6/2010 | Chen | ...................... | A47B 88/43 248/244 |
| 9,066,591 B2 * | 6/2015 | Chen | ................... | A47B 88/044 |
| 9,125,489 B2 * | 9/2015 | Chen | ................... | A47B 88/044 |
| 2012/0292274 A1 * | 11/2012 | Lin | ........................ | A47B 88/43 211/86.01 |
| 2013/0056432 A1 * | 3/2013 | Lin | ........................ | A47B 88/43 211/123 |

* cited by examiner

Primary Examiner — Tan Le
(74) Attorney, Agent, or Firm — Steven Reiss

(57) ABSTRACT

A sliding rail fixing structure in a server includes a sliding rail, a fastening plate with a fastening seat, and a clip. The fastening plate defines a restriction hole. The fastening seat includes a supporting member. The supporting member passes through the restriction hole to be positioned at a side of the fastening seat. A size of the supporting member matches a size of an installing hole defined on a pillar. The supporting member is positioned in the installing hole when the pillar is positioned at the side of the fastening seat. The clip can rotate on the fastening seat and includes a hook portion. The hook portion hooks onto the pillar to assemble the pillar to the sliding rail fixing structure. When the clip rotates through a preset angle, the hook portion moves away from the pillar to disassemble the pillar.

18 Claims, 8 Drawing Sheets

US 9,844,162 B2

SLIDING RAIL FIXING STRUCTURE OF SERVER CABINET

CROSS-REFERENCE TO RELATED APPLICATIONS

This application claims priority to Chinese Patent Application No. 201610222832.7, filed on Apr. 12, 2016, the contents of which are incorporated by reference herein.

FIELD

The subject matter herein generally relates to structure of server cabinets, especially to a sliding rail fixing structure for a server cabinet.

BACKGROUND

Server cabinets include a number of pairs of pillars and a number of pairs of sliding rails positioned between the pillars. A fixing plate is fixed to the sliding rail and is positioned between the sliding rail and the pillar. The fixing plate and the pillar define screw holes. Screws are positioned in the screw holes to fix the sliding rail and the pillar. Thus, when assembling or disassembling the pillar, a tool for assembling or disassembling the screw may be needed.

BRIEF DESCRIPTION OF THE DRAWINGS

Implementations of the present technology will now be described, by way of example only, with reference to the attached figures.

DETAILED DESCRIPTION

Figure 1:
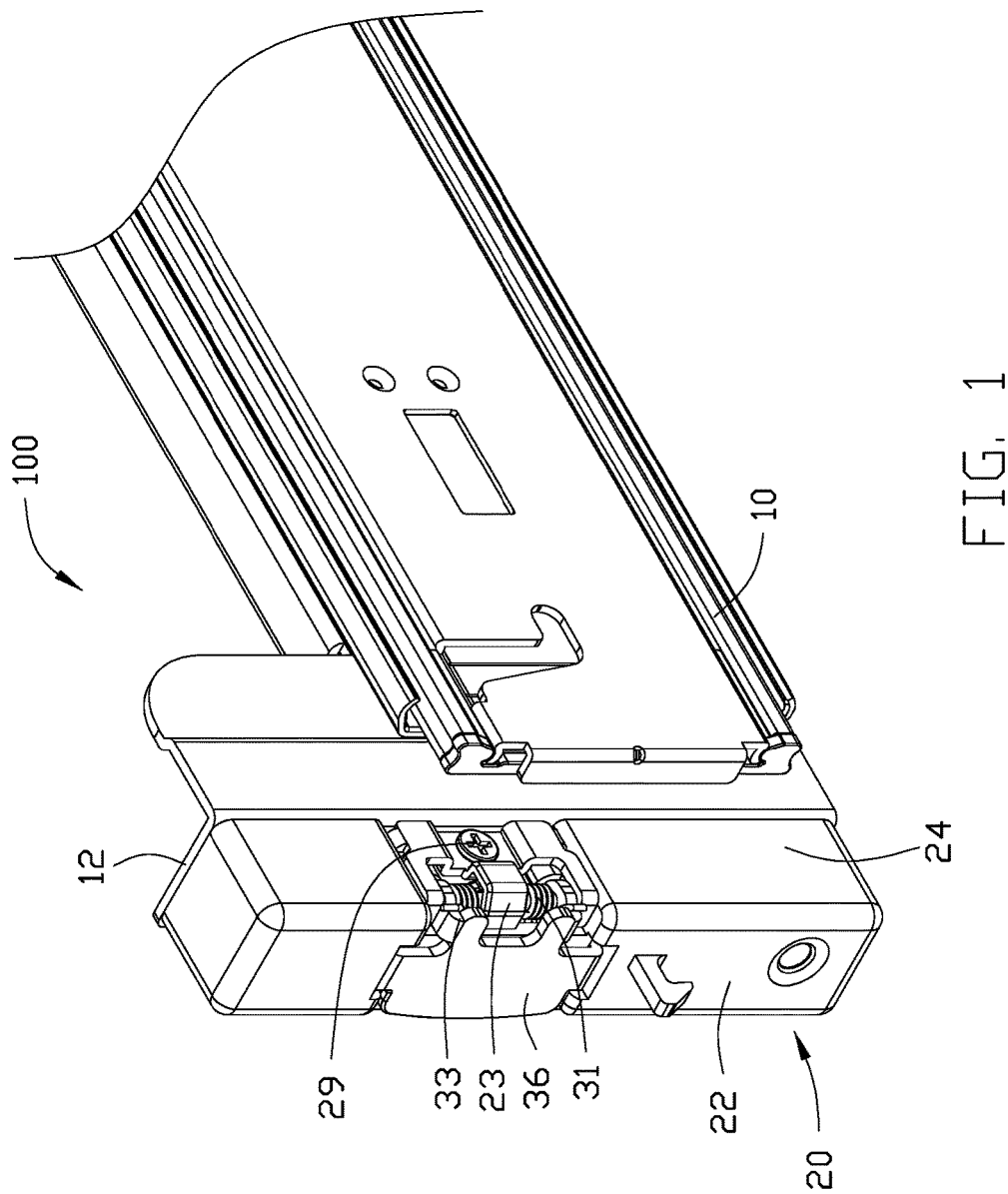
FIG. 1 is an isometric view of a sliding rail fixing structure in a server cabinet.
Figure 2:
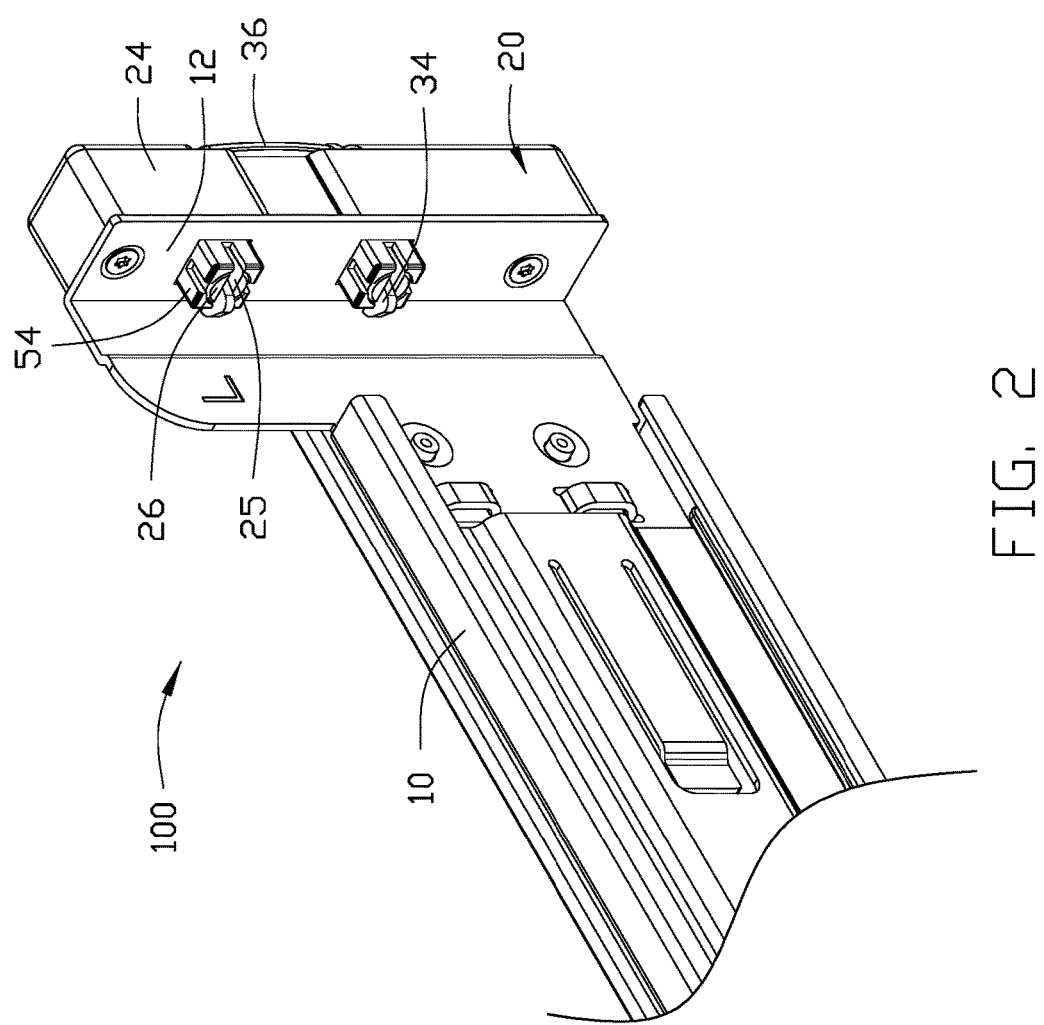
FIG. 2 is similar to FIG. 1, but viewed from a different viewpoint.
Figure 3:
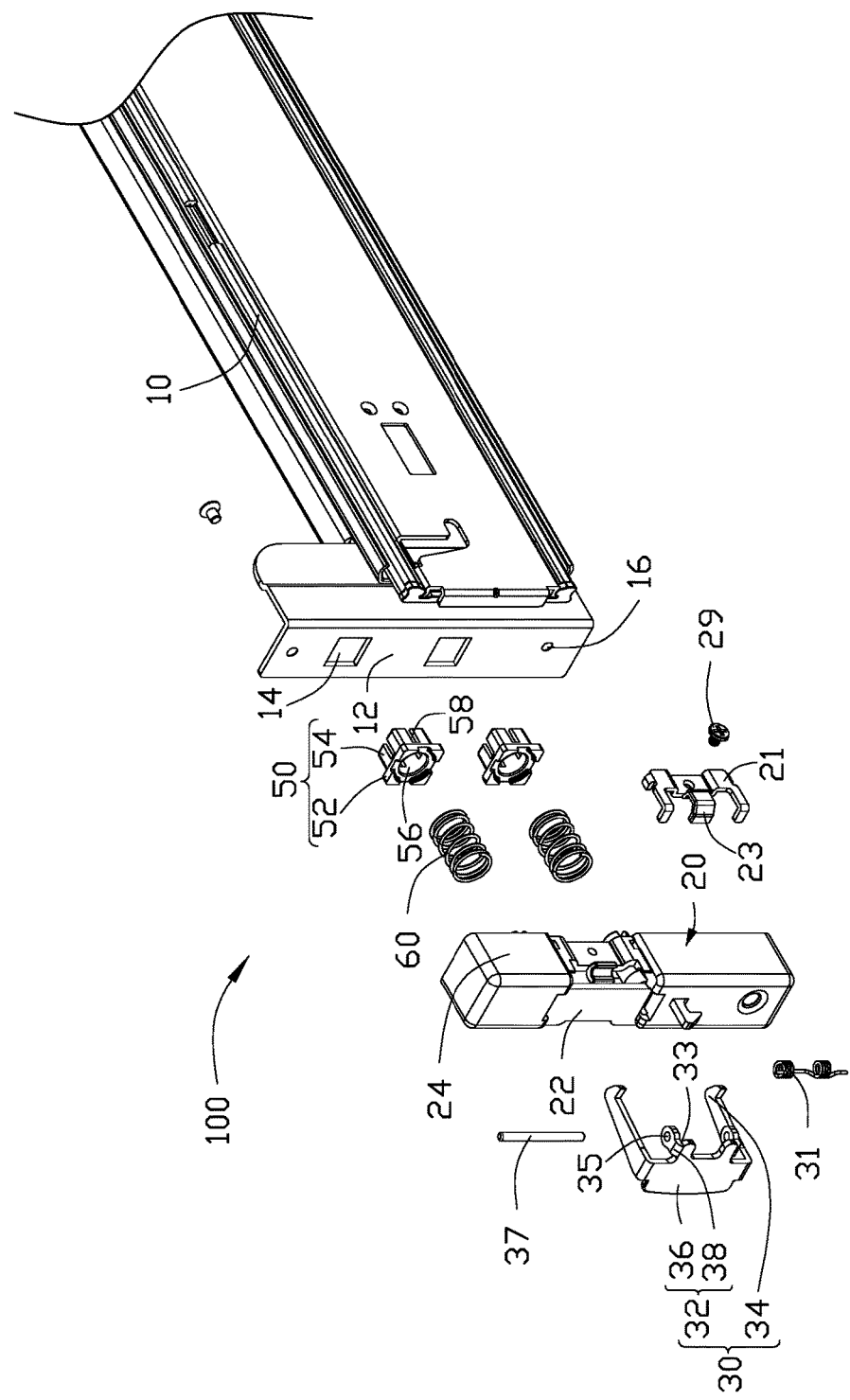
FIG. 3 is an exploded isometric view of the sliding rail fixing structure of FIG. 1.
Figure 4:
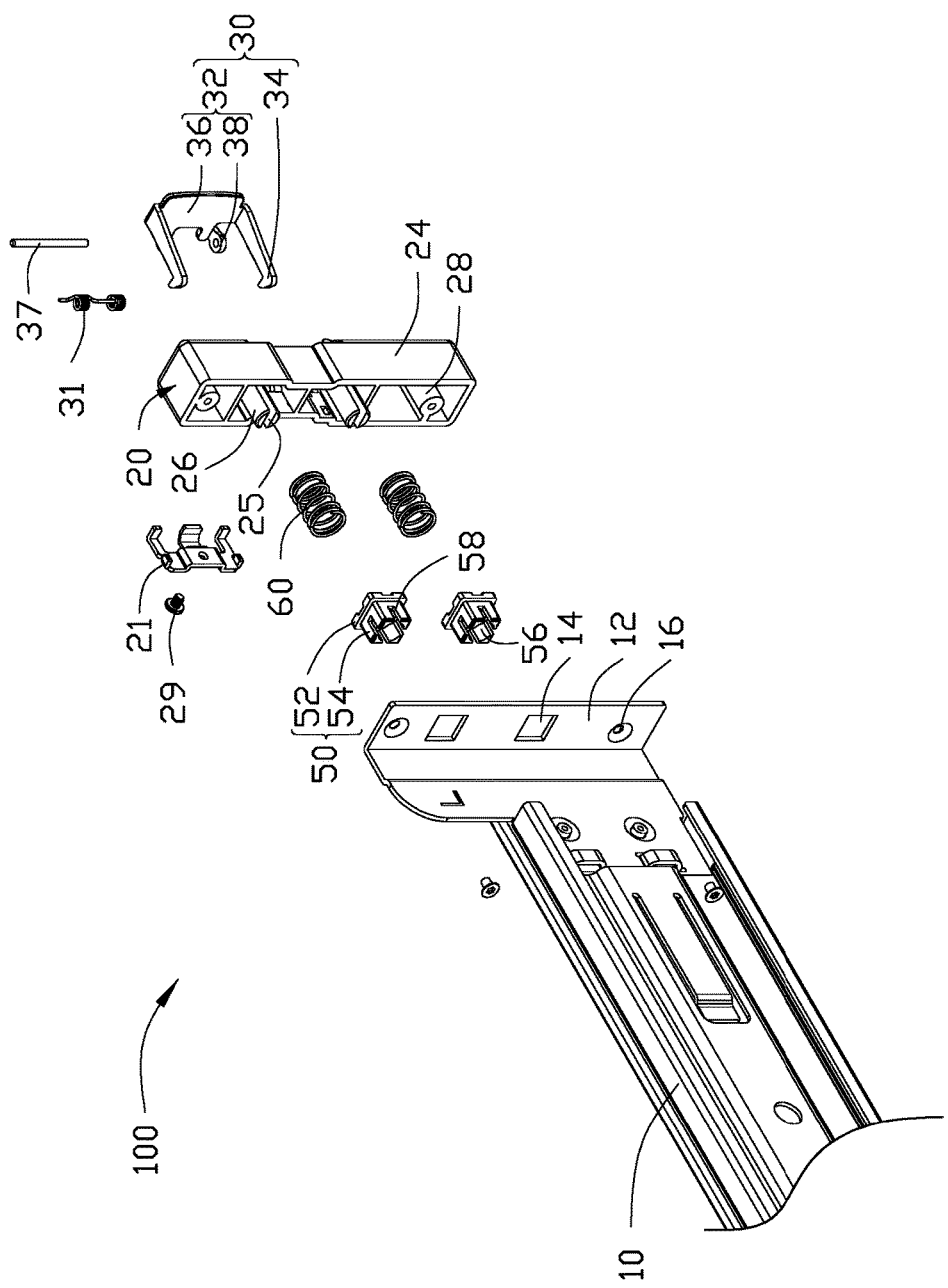
FIG. 4 is similar to FIG. 3, but viewed from a different viewpoint.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

A definition that applies throughout this disclosure will now be presented.

The term "comprising" means "including, but not necessarily limited to"; it specifically indicates open-ended inclusion or membership in a so-described combination, group, series, and the like.

FIGS. 1 to 4 illustrate a sliding rail fixing structure 100. The sliding rail fixing structure 100 is employed in a server cabinet. The sliding rail fixing structure 100 includes a sliding rail 10, a fastening plate 12 fixed to an end of the sliding rail 10, a fastening seat 20 fixed one side of the fastening plate 12, a clip 30, two elastic members 60, and two sleeves 50.

The fastening plate 12 is perpendicular to the sliding rail 10 and defines two restriction holes 14 and two first through holes 16. The fastening seat 20 includes a front surface 22 and two side surfaces 24 perpendicularly extending from opposite edges of the front surface 22 toward the fastening plate 12. Two supporting members 26 and two fastening posts 28 are fixed to the front surface 22. The two supporting members 26 (FIG. 4) are positioned between the two side surfaces 24. The ends of the two supporting member 26 away from the front surface 22 pass through the two restriction holes 14 in the fastening plate 12 to be positioned on the other side of the fastening plate 12. Each fastening post 28 defines a screw hole (not labeled). Two screws (not labeled) pass through the two first through holes 16 to be positioned in the two screw holes, to attach the fastening seat 20 to the fastening plate 12.

The two sleeves 50 are sleeved over the two supporting members 26. The two ends of the elastic member 60 abut against the fastening seat 20 and the sleeves 50, respectively. Further referring to FIG. 5, the sliding rail fixing structure 100 can be assembled to a first pillar 70. The first pillar 70 is positioned on the other side of the fastening plate 12 away from the fastening seat 20 and defines two first installing holes 72 aligned with the sleeve body 54. Under the elastic force of the elastic member 60, the two sleeves 50 are extendable out of the two restriction holes 14, to be positioned into two of the first installing holes 72. This positioning restricts the first pillar 70 to movement along the plane where the first installing hole 72 is located. The sleeve 50 defines a second through hole 56. The supporting member 26 is positioned in the second through hole 56. The sleeve 50 includes a stop plate 52 and a sleeve body 54 protruding from the stop plate 52. The elastic member 60 sleeves on the supporting member 26 and abuts the front surface 22 and the stop plate 52. Under the elastic force of the elastic member 60, the sleeve body 54 can pass through the restriction hole 14, and the stop plate 52 abuts against the side of the fastening plate 12 adjacent to the fastening seat 20. Thus, the stop plate 52 prevents the sleeve body 54 moving out of the restriction hole 14. Under external force, the sleeve body 54 overcomes the elastic force of the elastic member 60 to drive an end of the sleeve body 54 away from the elastic member 60, to be retracted in the restriction hole 14. The elastic member 60 may be a spring.

Figure 5:
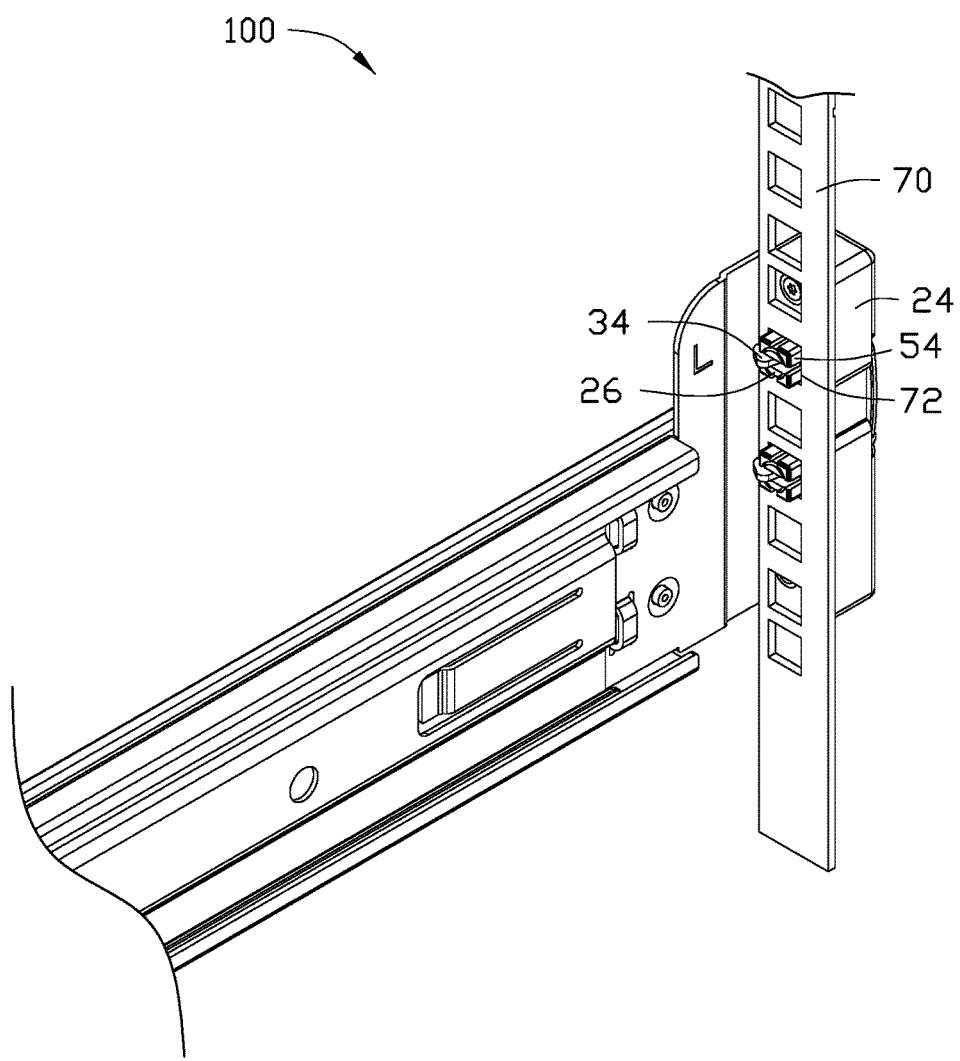
FIG. 5 is an isometric view of the sliding rail fixing structure of FIG. 1 attached to a first pillar.

The clip 30 includes a rotation portion 32 and two hook portions 34 attached to two ends of the rotation portion 32. The rotation portion 32 is rotatably fixed to the fastening seat 20. The two hook portions 34 pass through the two restriction holes 14 to be positioned at a side of the fastening plate 12 away from the fastening seat 20. When the sleeve body 54 is positioned in the first installing hole 72, the hook portion 34 hooks the first pillar 70 onto the sliding rail fixing structure 100 (FIG. 5). When the rotation portion 34 rotates through a preset angle, the hook portion 34 moves away from the first pillar 70 to detach and disassemble the first pillar 70 along the axial direction of the first fastening hole 72.

Figure 6:
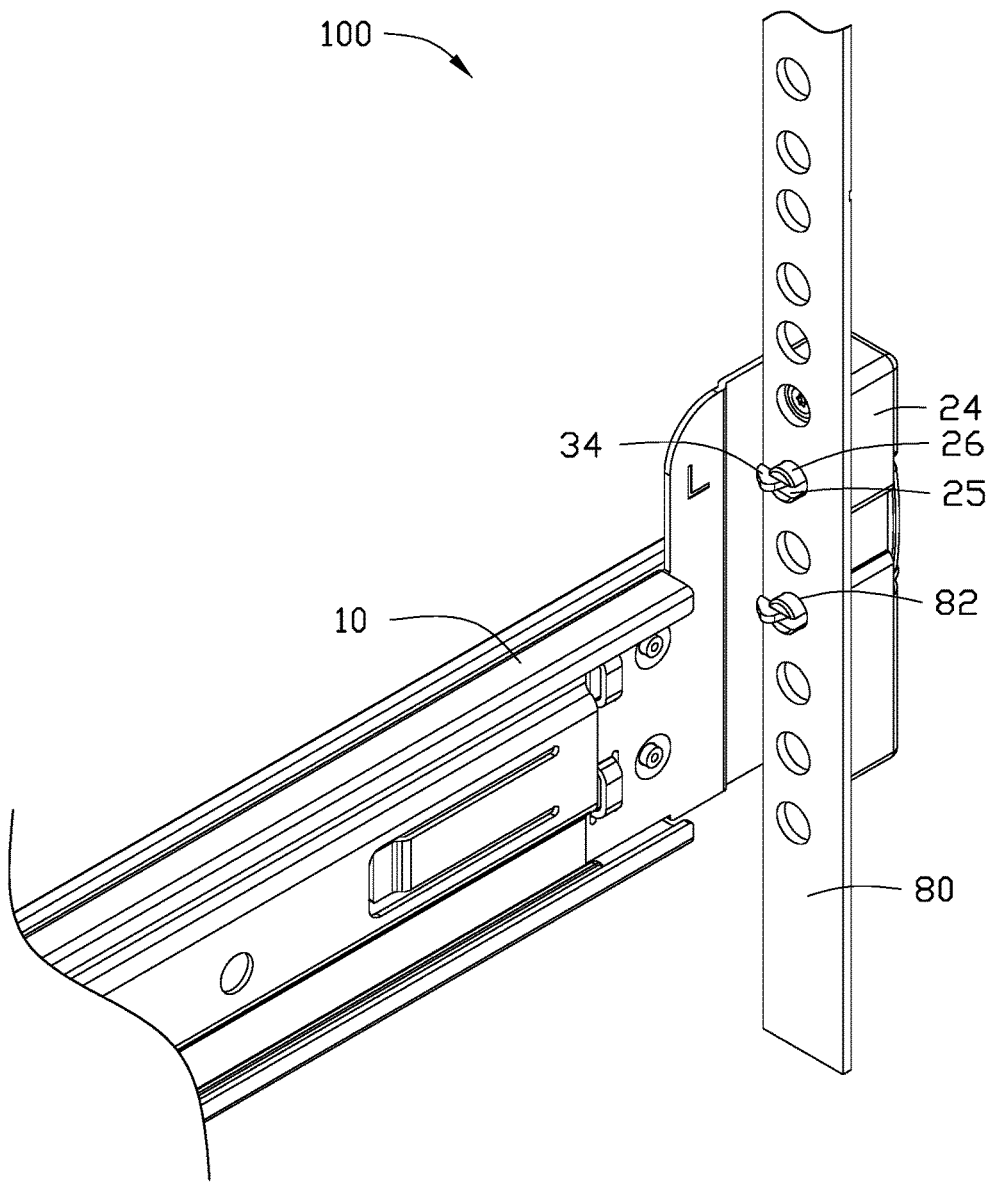
FIG. 6 is an isometric view of the sliding rail fixing structure of FIG. 1 attached to a second pillar.

Further referring to FIG. 6, a second pillar 80 can be fixed to the sliding rail fixing structure 100. The second pillar 80 defines two second fastening holes 82 aligned with the supporting member 26. When the hook portion 34 moves away from the first pillar 70 and the end of the sleeve body 54 which is away from the elastic member 60 is retracted in the restriction hole 14, the supporting member 26 can be received in the second fastening hole 82. This restricts the second pillar 70 to movement along the plane where the second installing hole 82 is located. When the supporting member 26 is positioned in the second fastening hole 82, the hook portion 34 hooks onto the second pillar 80 to fix the second pillar 70 to the sliding rail fixing structure 100. When the rotation portion 34 rotates through the preset angle, the hook portion 34 can break away from the second pillar 80 to detach and disassemble the second pillar 80 along an axial direction of the second fastening hole 82.

The fastening seat 20 defines a receiving groove 25. The receiving groove 25 penetrates to an end of the supporting member 26 away from the front surface 22 from a side of the front surface 22 away from the fastening plate 12. The hook portion 34 passes through the receiving groove 25 for positioning the side of the fastening plate 12 away from the fastening seat 20.

Figure 7:
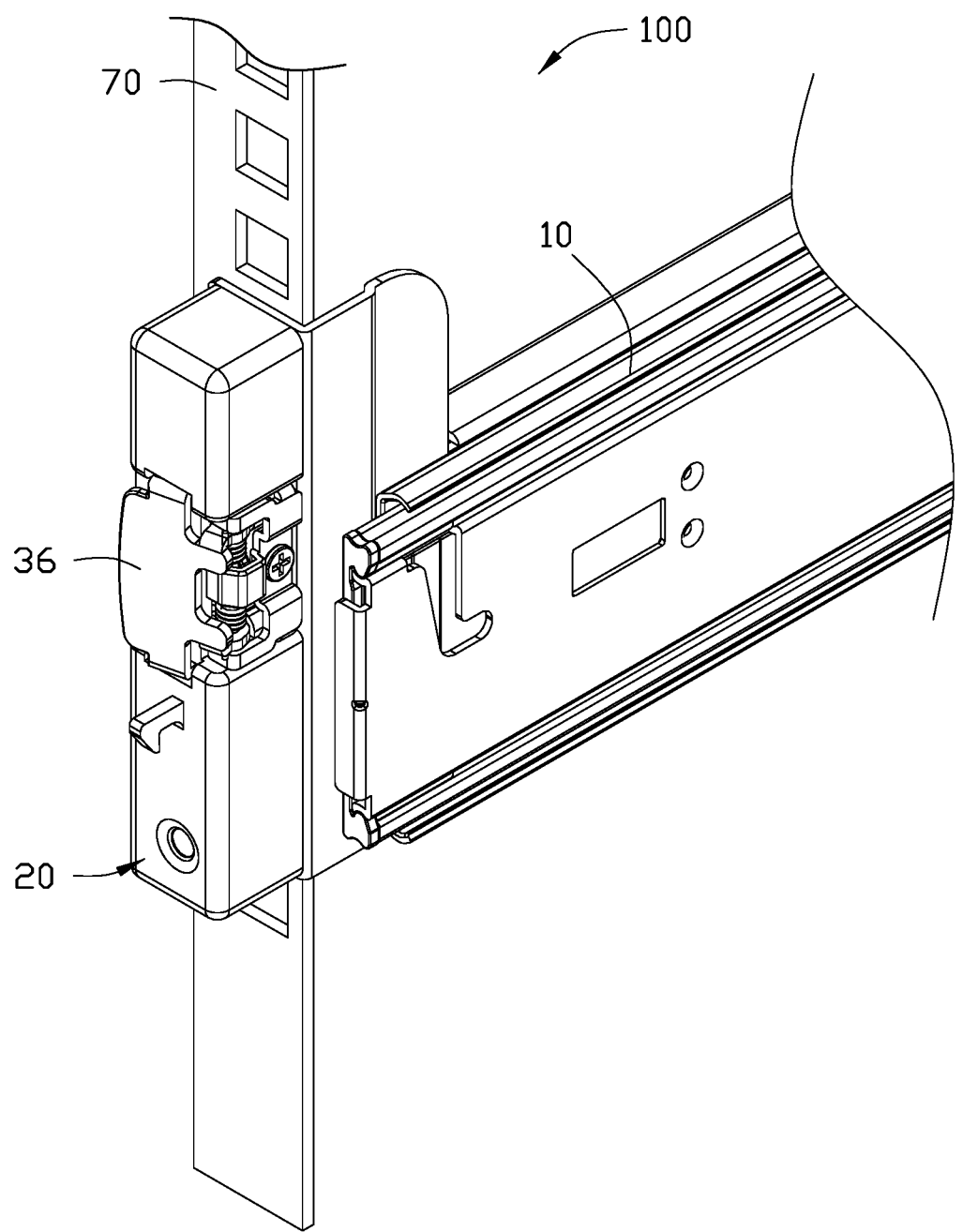
FIG. 7 is an isometric view of the disassembly of the first pillar of the sliding rail fixing structure of FIG. 1.
Figure 8:
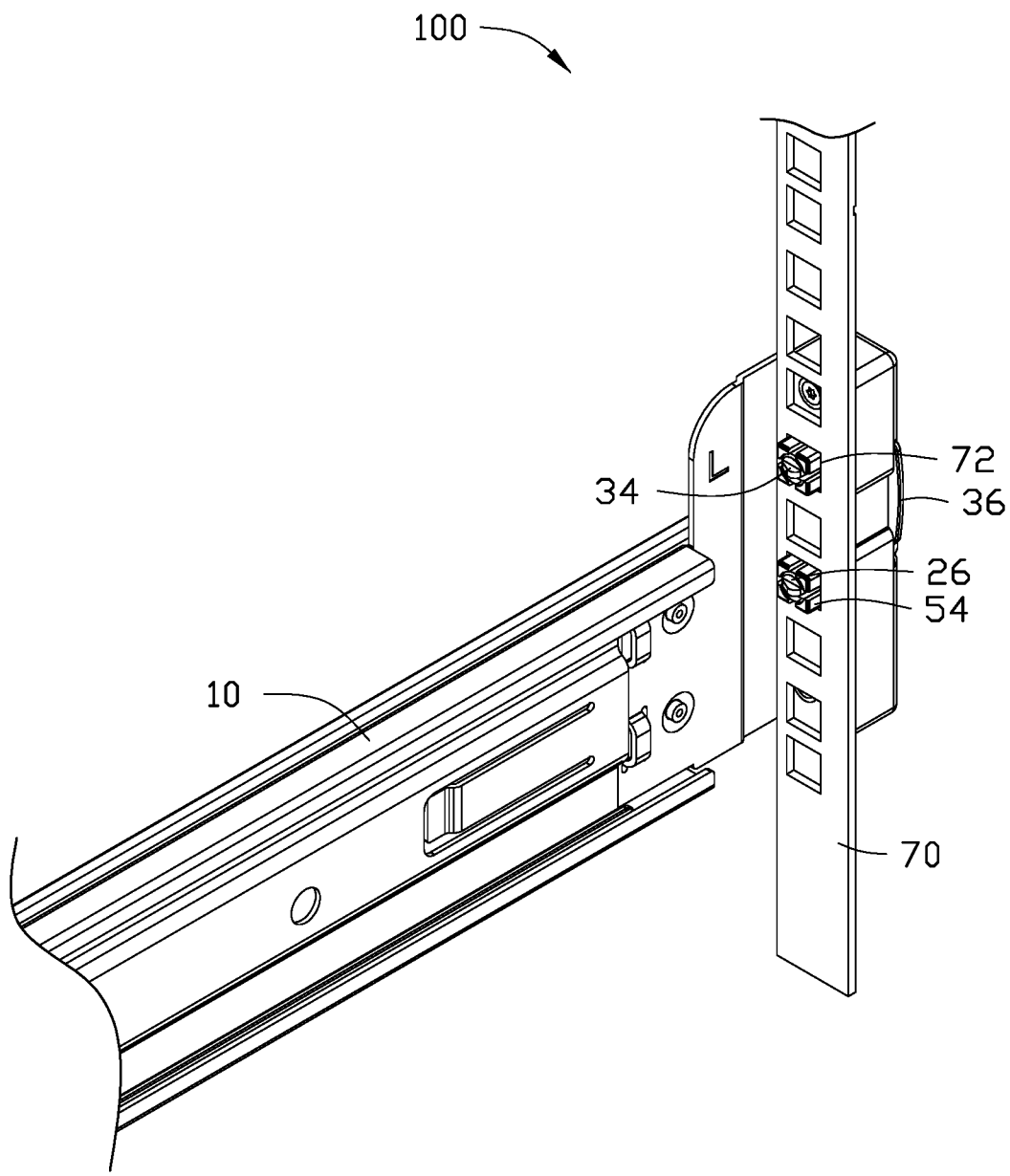
FIG. 8 is similar to FIG. 7, but viewed from a different viewpoint.

The supporting member 26 is cylindrical. The receiving groove 25 divides the cylinder into two half-cylinders. The sleeve body 54 is a square column and defines a restriction groove 58 communicating with the receiving groove 25. Further referring to FIGS. 7 and 8, when the rotation portion 32 is rotated, the hook portion 34 moves along the restriction groove 58 or along the receiving groove 25 to break away from the first pillar 70 or from the second pillar 80.

The rotation portion 32 is rotatably fixed to the side of the front surface 22 away from the fastening plate 12. The rotation portion 32 includes an operation portion 36 and two tab portions 38 perpendicular to the operation portion 36. The tab portion 38 defines a shaft hole 35. The axis of the shaft hole 35 is perpendicular to a plane where the hook portion 34 is located. A torsion spring 31 is positioned between the two tab portions. Two ends of the torsion spring 31 abut against a connection portion 33 where the operation portion 36 and the tab portion 38 are connected. A shaft 37 pass through the two shaft holes 35 and the torsion spring 31 and is fixed to the fastening seat 20.

The fastening seat 20 further includes a cover 21. The cover 21 is fixed to one side surface 24 by a screw 29. The cover 21 includes a pressing portion 23. The middle of the torsion spring 31 abuts against the pressing portion 23. Under the elastic force of the torsion spring 31, the rotation portion 32 abuts against the front surface 22 and the hook portion 34 can thus hook the first pillar 70 or the second pillar 80. Under external force, the operation portion 36 overcomes the elastic force of the torsion spring 31 to rotate, the hook portion rotating to follow and thus moves away from the first pillar 70 or the second pillar 80.

Thus, the first pillar 70 can be disassembled from the sliding rail fixing structure 100 along the axial direction of the first installing holes 72. The second pillar 80 can be disassembled from the sliding rail fixing structure 100 along the axial direction of the second installing holes 82.

The embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:
1. A sliding rail fixing structure comprising:
   a sliding rail;
   a fastening plate fixed to an end of the sliding rail, the fastening plate defining at least one restriction hole;
   a fastening seat fixed one side of the fastening plate, the fastening seat comprising at least one supporting member, the supporting member passing through the restriction hole for positioning a side of the fastening seat away from the fastening plate, a size of the supporting member aligned with an installing hole defining on a pillar, the supporting member configured for positioning in the installing hole when the pillar is positioned the side of the fastening seat away from the fastening plate;
   a clip rotatably fixed to the fastening seat; the clip comprising at least one hook portion, when the supporting member is positioned in the installing hole, the hook portion hooks the pillar to assemble the pillar to the sliding rail fixing structure, and when the clip rotates a preset angle, the hook portion moves away from the pillar to disassemble the pillar from the sliding rail fixing structures;
   at least one sleeve, the sleeve sleeved over the supporting member; and
   at least one elastic member, two ends of the elastic member abutting against the fastening seat and the sleeve;
   wherein under the elastic force providing by the elastic member, the sleeves partly extend out of the restriction hole for positioning in another installing hole defined on another pillar, a perimeter of the sleeve matches the perimeter of another installing hole, and under external force, the sleeve overcomes the elastic force of the elastic member to drive an end of the sleeve away from the elastic member to retract into the restriction hole and away from hooking the another pillar.

2. The sliding rail fixing structure as claimed in claim 1, wherein the sleeve comprises a stop plate and a sleeve body protruding from the stop plate, under the elastic force of the elastic member, the sleeve body passes through the restriction hole, and the stop plate abuts against the side of the fastening plate adjacent to the fastening seat to prevent the sleeve body moving out of the restriction hole.

3. The sliding rail fixing structure as claimed in claim 1, wherein the elastic member sleeves on the supporting member and one end of the elastic member abuts against the sleeve.

4. The sliding rail fixing structure as claimed in claim 1, wherein the elastic member is a spring.

5. The sliding rail fixing structure as claimed in claim 2, wherein the supporting member is cylindrical, the sleeve body is a square column, the sleeve body defines a through hole.

6. The sliding rail fixing structure as claimed in claim 5, wherein the fastening seat defines a receiving groove, the receiving groove penetrates from a side of the fastening seat away from the fastening plate to an end of the supporting member away from the fastening seat, the receiving groove divides the cylinder to two half-cylinders, the hook portion passes through the receiving groove for positioning the side of the fastening plate away from the fastening seat.

7. The sliding rail fixing structure as claimed in claim 6, wherein the sleeve body defines a restriction groove communicating with the receiving groove, when the clip is rotated, the hook portion moves along the restriction groove to be received in the restriction groove to break away from the said pillar or the said another pillar.

8. The sliding rail fixing structure as claimed in claim 1, wherein the clip comprises a rotation portion, the rotation portion is rotatably fixed to the fastening seat, the hook portion is fixed to the rotation portion.

9. The sliding rail fixing structure as claimed in claim 1, wherein the fastening seat includes a front surface and two side surfaces perpendicularly extending from two opposite edges of the front surface toward the fastening plate, the supporting member is fixed to the front surface.

10. A sliding rail fixing structure comprising:
a sliding rail;
a fastening plate fixed to an end of the sliding rail, the fastening plate defining at least one restriction hole;
a fastening seat fixed one side of the fastening plate, the fastening seat comprising at least one supporting member, the supporting member passing through the restriction hole for positioning a side of the fastening seat away from the fastening plate, a size of the supporting member aligned with an installing hole defining on a pillar, the supporting member configured for positioning in the installing hole to prevent the pillar from moving at a plane where the installing hole is located;
a clip rotatably fixed to the fastening seat; the clip comprising at least one hook portion, when the supporting member is positioned in the installing hole, the hook portion hooks the pillar to prevent the pillar from moving the axis direction of the installing hole, and when the clip rotates a preset angle, the hook portion moves away from the pillar to disassemble the pillar along the axis direction of the installing hole;
at least one sleeve, the sleeve sleeved over the supporting member; and
at least one elastic member, two ends of the elastic member abutting against the fastening seat and the sleeve;
wherein under the elastic force providing by the elastic member, the sleeves partly extend out of the restriction hole for positioning in another installing hole defined on another pillar, a size of the sleeve matches the another installing hole, and under external force, the sleeve overcomes the elastic force of the elastic member to drive an end of the sleeve away from the elastic member to retract in the restriction hole.

11. The sliding rail fixing structure as claimed in claim 10, wherein the sleeve comprises a stop plate and a sleeve body protruding from the stop plate, under the elastic force of the elastic member, the sleeve body passes through the restriction hole, and the stop plate abuts against the side of the fastening plate adjacent to the fastening seat to prevent the sleeve body moving out of the restriction hole.

12. The sliding rail fixing structure as claimed in claim 10, wherein the elastic member sleeves on the supporting member and one end of the elastic member abuts against the sleeve.

13. The sliding rail fixing structure as claimed in claim 10, wherein the elastic member is a spring.

14. The sliding rail fixing structure as claimed in claim 11, wherein the supporting member is cylindrical, the sleeve body is a square column, the sleeve body defines a through hole.

15. The sliding rail fixing structure as claimed in claim 14, wherein the fastening seat defines a receiving groove, the receiving groove penetrates from a side of the fastening seat away from the fastening plate to an end of the supporting member away from the fastening seat, the receiving groove divides the cylinder to two half-cylinders, the hook portion passes through the receiving groove for positioning the side of the fastening plate away from the fastening seat.

16. The sliding rail fixing structure as claimed in claim 15, wherein the sleeve body defines a restriction groove communicating with the receiving groove, when the clip is rotated, the hook portion moves along the restriction groove to be received in the restriction groove to break away from the said pillar or the said another pillar.

17. The sliding rail fixing structure as claimed in claim 10, wherein the clip comprises a rotation portion, the rotation portion is rotatably fixed to the fastening seat, the hook portion is fixed to the rotation portion.

18. The sliding rail fixing structure as claimed in claim 10, wherein the fastening seat includes a front surface and two side surfaces perpendicularly extending from two opposite edges of the front surface toward the fastening plate, the supporting member is fixed to the front surface.

* * * * *